(12) United States Patent
Wang et al.

(10) Patent No.: US 11,941,329 B2
(45) Date of Patent: Mar. 26, 2024

(54) METHOD FOR ANALYZING FUSELAGE PROFILE BASED ON MEASUREMENT DATA OF WHOLE AIRCRAFT

(71) Applicant: Nanjing University of Aeronautics and Astronautics, Nanjing (CN)

(72) Inventors: Jun Wang, Nanjing (CN); Tianchi Zhong, Nanjing (CN); Zhongde Shan, Nanjing (CN); Yuan Zhang, Nanjing (CN); Kun Xiao, Nanjing (CN)

(73) Assignee: Nanjing University of Aeronautics and Astronautics, Nanjing (CN)

( * ) Notice: Subject to any disclaimer, the term of this patent is extended or adjusted under 35 U.S.C. 154(b) by 0 days.

(21) Appl. No.: 18/313,410

(22) Filed: May 8, 2023

(65) Prior Publication Data

US 2023/0274047 A1    Aug. 31, 2023

(30) Foreign Application Priority Data

May 6, 2022    (CN) .......................... 202210483143.7

(51) Int. Cl.
*G06F 30/15*    (2020.01)
*B64C 1/00*    (2006.01)

(52) U.S. Cl.
CPC ................ *G06F 30/15* (2020.01); *B64C 1/00* (2013.01)

(58) Field of Classification Search
CPC .......... G06F 30/00; G06F 30/15; G06F 30/17; B64C 1/00; B64C 1/068; B64F 5/60; Y02T 90/00; G06Q 10/06393
USPC ....................................................... 703/8, 6
See application file for complete search history.

(56) References Cited

U.S. PATENT DOCUMENTS 10,350,839 B2 *    7/2019  Safai .................... G05B 19/048
2022/0017235 A1 *    1/2022  Lee ........................ G08G 5/025

FOREIGN PATENT DOCUMENTS

| CN | 102084212 A | * | 6/2011 | ............. G01B 11/24 |
| CN | 107223268 A | | 9/2017 | |
| CN | 110030951 A | | 7/2019 | |

(Continued)

OTHER PUBLICATIONS

Wang, Yan et al., "Density-Invariant Registration of Multiple Scans for Aircraft Measurement", 2021, IEEE Transactions on Instrumentation and Measurement, vol. 70, IEEE. (Year: 2021).*

(Continued)

*Primary Examiner* — Cedric Johnson

(57) ABSTRACT

A method for analyzing fuselage profile based on measurement data of an aircraft, including: acquiring point-cloud data of an aircraft via a laser scanner; selecting point-cloud data of a fuselage component from the point-cloud data of the aircraft; based on a weighted locally optimal projection (WLOP) operator and $L_1$ median curve-skeleton concept of point cloud, extracting a medial axis from the point-cloud data of the fuselage component; uniformly sampling the medial axis into a plurality of skeleton points; extracting a discrete point set of a cross-section contour of the fuselage component; performing circle fitting on the discrete point set to obtain a fitted circle and parameters thereof; calculating a deformation displacement measurement indicator $\mu$ of the cross-section of the fuselage component to evaluate cross-section contour of the fuselage.

7 Claims, 4 Drawing Sheets

(56) References Cited

FOREIGN PATENT DOCUMENTS

| | | | |
|---|---|---|---|
| CN | 113865570 A | | 12/2021 |
| CN | 114373358 A | * | 4/2022 |

OTHER PUBLICATIONS

Motianlun, "Random Sampling Consistency (RANSAC)", www.modb.prodb129835, Aug. 31, 2021, Paragraph 1 of p. 1—last paragraph of p. 3.

* cited by examiner

METHOD FOR ANALYZING FUSELAGE PROFILE BASED ON MEASUREMENT DATA OF WHOLE AIRCRAFT

CROSS-REFERENCE TO RELATED APPLICATIONS

This application claims the benefit of priority from Chinese Patent Application No. 202210483143.7, filed on May 6, 2022. The content of the aforementioned application, including any intervening amendments thereto, is incorporated herein by reference in its entirety.

TECHNICAL FIELD

This application relates to three-dimensional point cloud measurement, and more particularity to a method for analyzing fuselage profile based on measurement data of an aircraft.

BACKGROUND

Considering that the aircraft fuselage generally has a complex contour, and is prone to deformation which changes dynamically due to external loads during the aircraft assembly, it is arduous to strictly control the dimensional accuracy of the aircraft structure. In addition, in the deformation detection, it is troublesome to generate a single curve surface satisfying the requirements by curve surface fitting of the initial point cloud data. Moreover, the fitted curve surface fails to meet the requirements in terms of smoothness and the number of control points. Generally, large-sized and massive aircraft point-cloud data is acquired, and thus if the cross section is extracted by global fitting of all point-cloud data, a large amount of time is required for calculation, which significantly lowers the data processing efficiency.

SUMMARY

An object of this application is to provide a medial-axis curve skeleton-driven method for analyzing deformation of aircraft components to analyze the deformation more comprehensively and automatically, and improve the early warning ability, so as to meet the requirements of the on-site aircraft maintenance.

Technical solutions of this application are described as follows.

This application provides a method for analyzing fuselage profile based on measurement data of an aircraft, comprising:

(S1) acquiring point-cloud data of the aircraft via a laser scanner; selecting point-cloud data of a fuselage component from the point-cloud data of the aircraft; and setting a bounding box of the point-cloud data of the fuselage component;

(S2) based on a weighted locally optimal projection (WLOP) operator, extracting a medial axis of the fuselage component from the point-cloud data of the fuselage component according to $L_1$ median curve-skeleton concept of point cloud;

(S3) uniformly sampling the medial axis of the fuselage component into a plurality of skeleton points; and extracting a discrete point set of a cross-section contour of the fuselage component;

(S4) performing circle fitting on the discrete point set of the cross-section contour of the fuselage component to obtain a fitted circle of each cross-section slice of the fuselage component and parameters of the fitted circle; and (S5) calculating a deformation displacement measurement indicator μ of the cross-section of the fuselage component to evaluate a profile of the cross-section of the fuselage component.

In an embodiment, the step (S2) comprises:
subjecting the point-cloud data of the fuselage component to smoothing and resampling based on the WLOP operator; and
extracting $L_1$ median skeletons varying in size from the point-cloud data of the fuselage component by using a $L_1$ median target energy function with a regular term based on the $L_1$ median curve-skeleton concept to obtain the medial axis of the fuselage component.

In an embodiment, the $L_1$ median target energy function is expressed as follows:

$$L = \operatorname*{argmin}_{x} \sum_{i \in I} \sum_{j \in J} \|x_i - q_j\| \, \theta(\|x_i - q_j\|) + \left(\sum_{i \in I} \gamma_i\right) \sum_{i' \in I \setminus \{i\}} \frac{\|x_i - x_{i'}\|}{x_i - x_{i'}};$$

wherein J is the point-cloud data of the fuselage component; j represents an index of a point in the point-cloud data of the fuselage component; $q_j$ represents a j-th point in the point-cloud data of the fuselage component; I represents a set of points on each of the $L_1$ median skeletons; i represents an index of points on the $L_1$ median skeleton; $x_i$ is an i-th point on the $L_1$ median skeleton; $\gamma_1$ is an equilibrium parameter; θ( ) indicates a distance weight function; and $x_{i'}$ indicates a point except for $x_i$ on the $L_1$ median skeleton.

In an embodiment, step (S3) comprises:

(S301) uniformly sampling the medial axis of the fuselage component into the plurality of skeleton points at an interval of 2% of a length of a long diagonal of the bounding box;

(S302) with regard to a skeleton point from the plurality of skeleton points, selecting a point on a front side of the skeleton point and a point on a rear side of the skeleton point; respectively forming a cross-section slice at the skeleton point, the point on a front side of the skeleton point and the point on a rear side the skeleton point, wherein three cross-section slices are perpendicular to a plane where the medial axis of the fuselage component is located; and (S303) constructing three local polar coordinate systems centered around the skeleton point, the point on a front side of the skeleton point and the point on a rear side of the skeleton point, respectively; and performing point cloud searching at equal angle by using the three local polar coordinate systems to extract the discrete point set of the cross-section contour of the fuselage component.

In an embodiment, during the point cloud searching, if the point-cloud data of the fuselage component is not found along a direction, a local curve fitting is performed on the point-cloud data of the fuselage component in a neighborhood of the direction, and point coordinates of a corresponding cross-section along the direction are interpolated.

In an embodiment, step (S4) comprises:

(S401) regarding any cross-section slice $S_y$, initializing parameters of random sample and consensus (RANSAC) algorithm; setting the maximum number of iterations W; and assuming a score $S(c_0)$ and a threshold of an initial candidate circle $c_0$;

(S402) calculating a sampling probability of each point inside the cross-section slice based on sampling point density of the cross-section slice;

(S403) during one circle fitting, replacing random sampling in the RANSAC algorithm with sampling based on the sampling probability obtained in (S402), and calculating parameters $(a_d, b_d, r_d)$ of a candidate circle $C_d$ corresponding to the sampling probability, wherein $a_d$ indicates a first point on the candidate circle $C_d$; $b_d$ indicates a second point on the candidate circle $C_d$, and $r_d$ indicates a radius of the candidate circle $C_d$;

(S404) counting a sampling density of each inlier in an inlier set within a threshold of the candidate circle $C_d$, and taking the sampling density as a score $S(C_d)=\sum_{e=1}^{m} D_{te}$ of the candidate circle $C_d$, wherein m represents the number of inliers; e is an index of the inliers; and $D_{te}$ is a sampling density of an e-th inlier in the inlier set;

(S405) if $S(C_d)>S(C_0)$, assigning $S(C_d)$ to $S(c_0)$, and deriving the parameters $(a_d, b_d, r_d)$ of the candidate circle $C_d$; and (S406) if the number of fittings N<W, repeating steps (S403)-(S405); and if N W, obtaining fitted circles of all cross-section slices and parameters thereof.

In an embodiment, the maximum number of iterations W is expressed as follows:

$$W = \frac{\log(1-p)}{\log(1-q^n)}, q = \frac{S(C_0)}{|S_v|};$$

wherein n is the number of points sampled each time; p is a confidence level of the RANSAC algorithm, and p=0.9; q is a ratio of a sampling density of a current candidate circle to the cross-section slice.

In an embodiment, in step (S402), the sampling probability of each point inside the cross-section slice is expressed as follows:

$$p_{vk} = \frac{D_{vk} - D_{min}}{D_{max} - D_{min}}, D_{vk} = \frac{|l|}{\pi r^2};$$

wherein $p_{vk}$ indicates a sampling probability of a k-th point inside the cross-section slice; $D_{Vk}$ indicates a sampling density of the k-th point inside the cross-section slice; |l| indicates the number of points contained in a local neighborhood l centered around the k-th point; r is a radius of the local neighborhood l; $D_{max}$ indicates a maximum sampling density inside the cross-section slice; and $D_{min}$ indicates a minimum sampling density inside the cross-section slice.

In an embodiment, wherein the deformation displacement measurement indicator μ is expressed as follows:

$$\mu = \frac{p_a - O}{\|p_a - O\|} \cdot (p_a' - p_a);$$

wherein $p_a$ indicates a point on a projection plane where an angle between a fitted circle and an origin of a polar coordinate system is a; O is a center point of the polar coordinate system after the cross-section slice is aligned with the projection plane; and $p_a'$ is a point whose cross-section curve after deformation has an angle of a.

In an embodiment, the cross-section curve after deformation represents a deformation curve between the fitted circle and original fuselage profile data.

Compared with the prior art, this application has the following beneficial effects.

The method provided herein replaces the fitting of the overall curved surface of the aircraft with the fitting of local cross-section contour curve, which can not only avoid the massive calculations in the global fitting, but also effectively reduce the calculation cost. At the same time, in the method provided herein, the curve fitting can be performed on a specified position based on the local point-cloud data at the specified position, which eliminates the interference of other irrelevant data, so as to ensure the curve fitting accuracy.

DETAILED DESCRIPTION OF EMBODIMENTS

This application will be described in detail below with reference to the accompanying drawings.

Figure 1:
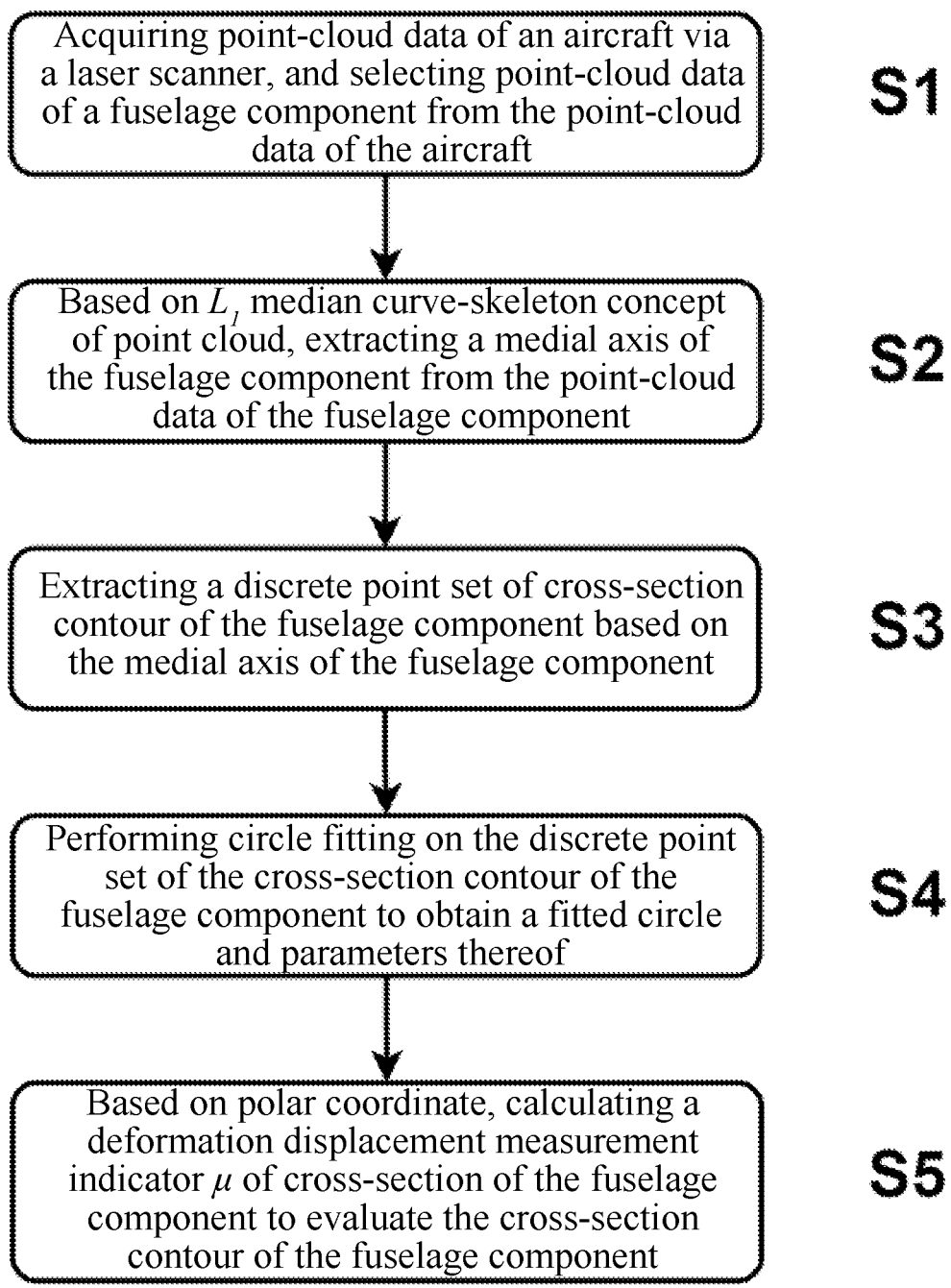
FIG. 1 is a flow chart of a method for analyzing fuselage profile based on measurement data of an aircraft according to an embodiment of this disclosure.

Referring to an embodiment shown in FIG. 1, a method for analyzing fuselage profile based on measurement data of an aircraft is provided, which is performed as follows.

Figure 2:
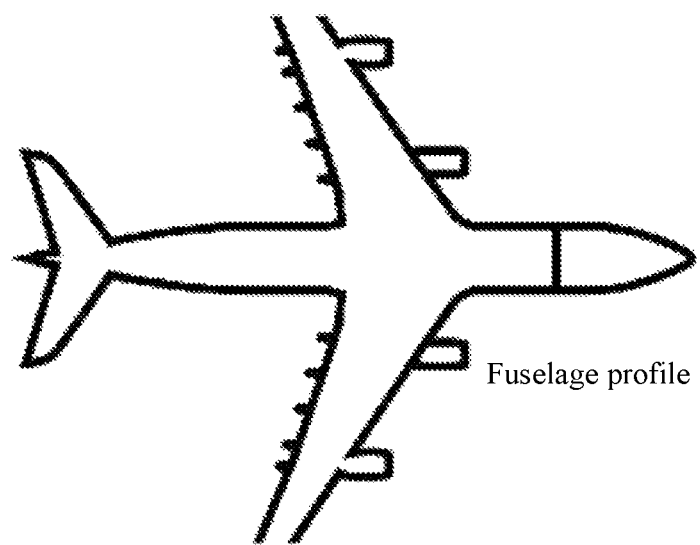
FIG. 2 shows point-cloud data of a fuselage component according to an embodiment of this disclosure.

(S1) Point-cloud data of an aircraft is acquired via a laser scanner. Point-cloud data of a fuselage component is selected from the point-cloud data of the aircraft, which is shown in FIG. 2. A fuselage bounding box of the point-cloud data of the fuselage component is set.

(S2) Based on a weighted locally optimal projection (WLOP) operator, a medial axis of the fuselage component is extracted from the point-cloud data of the fuselage component according to $L_1$ median curve-skeleton concept of point cloud. The $L_1$ median curve-skeleton is allowed to express the aircraft. When cutting to obtain the cross-section contour, it is necessary to figure out the spatial attitude of the fuselage at the cutting position, so as to keep the cutting plane orthogonal with the fuselage surface. More specifically, the point-cloud data of the fuselage component is subjected to smoothing and resampling based on the WLOP operator. $L_1$ median skeletons varying in size are extracted from the point-cloud data of the fuselage component by using a $L_1$ median target energy function with a regular term based on the $L_1$ median curve-skeleton concept to obtain the medial axis of the fuselage component. Specifically, by continuously expanding the neighborhood, a smaller neighborhood is shrunk, and the skeleton branch points are fixed and neatly arranged to form skeleton branches, and then the radius of the neighborhood is continuously expanded to find a new branch until all the skeleton points are connected to the skeleton branch. The $L_1$ median target energy function is expressed as follows:

$$L = \operatorname*{argmin}_{x} \sum_{i \in I} \sum_{j \in J} \|x_i - q_j\| \, \theta(\|x_i - q_j\|) + \left(\sum_{i \in I} \gamma_i\right) \sum_{i' \in I \setminus \{i\}} \frac{\|x_i - x_{i'}\|}{x_i - x_{i'}};$$

where J is the point-cloud data of the fuselage component; j represents an index of a point in the point-cloud data of the fuselage component; $q_j$ represents a j-th point in the point-cloud data of the fuselage component; I represents a set of points on the $L_1$ median skeleton; i represents an index of points on the $L_1$ median skeleton; $x_i$ is an i-th point on the $L_1$ median skeleton; $\gamma_1$ is an equilibrium parameter; $\theta(\ )$ indicates a distance weight function; and i' indicates a point except for i on the $L_1$ median skeleton. The first term in the target energy function L is a paradigm-based median filter term for noise, outliers, and large areas missing data robust; the second term is a regularization term configured to resist the influence of point cloud distribution, which is capable of adjusting the repulsive force between projection points. At the same time, the centrality of the $L_1$ median skeleton is assisted by the post-processing of circle fitting, so as to obtain the medial axis of the fuselage component. Compared to the curve skeleton extraction method based on prior knowledge of generalized rotational symmetry axis (ROSA), $L_1$-median skeleton does not strongly require the quality of the input point cloud and the geometric topology of the captured shapes, so as to better maintain the geometric topology of the model, without needing to perform estimation on the complicated normal vector information to compensate for the missing data. The key to the method provided herein is that it has outstanding properties such as robustness to outliers and noise, which can effectively manage non-cylindrical structures.

(S3) The medial axis of the fuselage component is uniformly sampled into a plurality of skeleton points. A discrete point set of a cross-section contour of the fuselage component is extracted. By uniformly sampling the medial axis of the fuselage component, the variation of the fuselage profile is reflected can be fully reflected, facilitating the subsequent extraction and expression of the position information of the fuselage, which is specifically performed as follows:

(S301) The medial axis of the fuselage component is uniformly sampled into the plurality of skeleton points at an interval of 2% of a length of a long diagonal of the bounding box. 2% of a length of a long diagonal of the fuselage bounding box is taken as an interval for uniform sampling, which not only avoids complicated calculation caused by excessive sampling points, but also considers the global representativeness of the sampling points.

(S302) With regard to a skeleton point from the plurality of skeleton points, a point is selected on a front side of the skeleton point and a point on a rear side of the skeleton point, respectively. A cross-section slice at the skeleton point, the point on a front side of the skeleton point and the point on a rear side the skeleton point are respectively formed. Three cross-section slices are perpendicular to a plane where the medial axis of the fuselage component is located. Thus, enough samples are collected to ensure that the cutting plane remains orthogonal with the fuselage surface.

(S303) Three local polar coordinate systems centered around the skeleton point, the point on a front side of the skeleton point and the point on a rear side of the skeleton point are constructed, respectively. Point cloud searching is performed at equal angle by using the three local polar coordinate systems to extract the discrete point set of the cross-section contour of the fuselage component to facilitate the uniform sampling of the fuselage at multiple angles and reflection of the variation of the fuselage profile.

Figure 3:
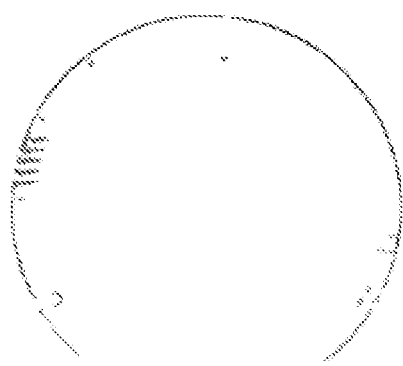
FIG. 3 is a schematic diagram of a discrete point set of a cross-section contour of the fuselage component according to an embodiment of this disclosure.

In this embodiment, during the point cloud searching at equal angle, if the point-cloud data of the fuselage component is not found along a direction, a local curve fitting is performed on the point-cloud data of the fuselage component in a neighborhood of the direction, and point coordinates of a corresponding cross-section along the direction are interpolated. FIG. 3 shows a discrete point set of the cross-section contour of the fuselage component extracted from a cross-section slice.

(S4) Circle fitting is performed on the discrete point set of the cross-section contour of the fuselage component to obtain a fitted circle of each cross-section slice of the fuselage component and the parameters of the fitted circle. The circle fitting process has the advantages of high speed and high efficiency, and can accurately reflect the deformation of the fuselage in all directions. Step (S4) is specifically performed as follows.

Regarding any cross-section slice $S_v$, parameters of random sample and consensus (RANSAC) algorithm are initialized, the maximum number of iterations W is set, and a score $S(c_0)$ and a threshold of an initial candidate circle $c_0$ are assumed. The maximum number of iterations W is expressed as follows:

$$W = \frac{\log(1-p)}{\log(1-q^n)}, \quad q = \frac{S(C_0)}{|S_v|};$$

where n is the number of points sampled each time, p is a confidence level of the RANSAC algorithm, and p=0.9; q is a ratio of a sampling density of a current candidate circle to the cross-section slice. The threshold and the maximum number of iterations are set, which not only ensures the accuracy of the algorithm results, but also controls the calculation amount to be within a reasonable range.

(S402) A sampling probability of each point inside the cross-section slice is calculated based on sampling point density of the cross-section slice. The sampling probability of each point inside the cross-section slice is expressed as follows:

$$p_{vk} = \frac{D_{vk} - D_{min}}{D_{max} - D_{min}}, \quad D_{vk} = \frac{|l|}{\pi \, r^2};$$

where $p_{vk}$ indicates a sampling probability of a k-th point inside the cross-section slice; $D_{vk}$ indicates a sampling density of the k-th point inside the cross-section slice; $|l|$ indicates the number of points contained in a local neighborhood l centered around the k-th point, r is a radius of the local neighborhood l, $D_{max}$ indicates a maximum sampling point density inside the cross-section slice; and $D_{min}$ indicates a minimum sampling point density inside the cross-section slice.

(S403) During one circle fitting, a random sampling in the RANSAC algorithm is replaced with sampling based on the sampling probability obtained in (S402), and parameters ($a_d$, $b_d$, $r_d$) of a candidate circle $C_d$ corresponding to the sampling probability are calculated, where $a_d$ indicates a first point on the candidate circle $C_d$, $b_d$ indicates a second point on the candidate circle $C_d$, and $r_d$ indicates a radius of the candidate circle $C_d$. During the cross-section fitting based on RANSAC, the sampling probability of each point in the point-cloud data is consistent, such that RANSAC algorithm is called a random sample and consensus algorithm. However, even though RANSAC algorithm can still accurately perform fitting on the cross-section and can be applied as the key technology of aircraft shape deformation detection based on point cloud deep learning, it takes a relatively long time to perform the RANSAC algorithm. Moreover, the sampling density around the data noise and outliers in the point cloud of the fuselage is commonly low, and the data noise and outliers often exist in the form of a single isolated point. Therefore, the RANSAC algorithm is improved herein. The sampling density of each point is calculated, and the sampling probability of each point is adaptively weighted by sampling density, which overcomes the above shortcomings of RANSAC algorithm in the detection of aircraft shape deformation.

(S404) A sampling density of each inlier in an inlier set within a threshold of the candidate circle $C_d$ is counted, and the sampling density is taken as a score $S(C_d)=\Sigma_{e=1}^{m}D_{te}$ of the candidate circle $C_d$, where m represents the number of inliers; e is an index of the inliers; and $D_{te}$ is a sampling density of an e-th inlier in the inlier set.

(S405) If $S(C_d)>S(C_0)$, $S(C_d)$ is assigned to $S(c_0)$, and the parameters ($a_d$, $b_d$, $r_d$) of the candidate circle $C_d$ are derived. The candidate circle is scored to intuitively and quantitatively evaluate the candidate fitted circle followed by continuous iterations to obtain a more suitable fitted circle.

(S406) If the number of fittings N<W, steps (S403)-(S405) are repeated, and if N≥W, the fitted circles of all cross-section slices and parameters thereof are obtained.

(S501) A deformation displacement measurement indicator μ of cross-section of the fuselage component is calculated to evaluate a profile of the cross-section contour of the fuselage component. The deformation displacement measurement indicator μ of the cross-section is expressed as follows.

$$\mu = \frac{p_a - O}{\|p_a - O\|} \cdot (p'_a - p_a);$$

where $p_a$ indicates a point on a projection plane where an angle between a fitted circle and an origin of a polar coordinate system is a; O is a center point of the polar coordinate system after the cross-section slice is aligned with the projection plane; and $p_a'$ is a point whose cross-section curve after deformation has an angle of a. Specifically, the cross-section curve after deformation refers to a deformation curve of the fitted circle and original fuselage profile data.

Figure 4:
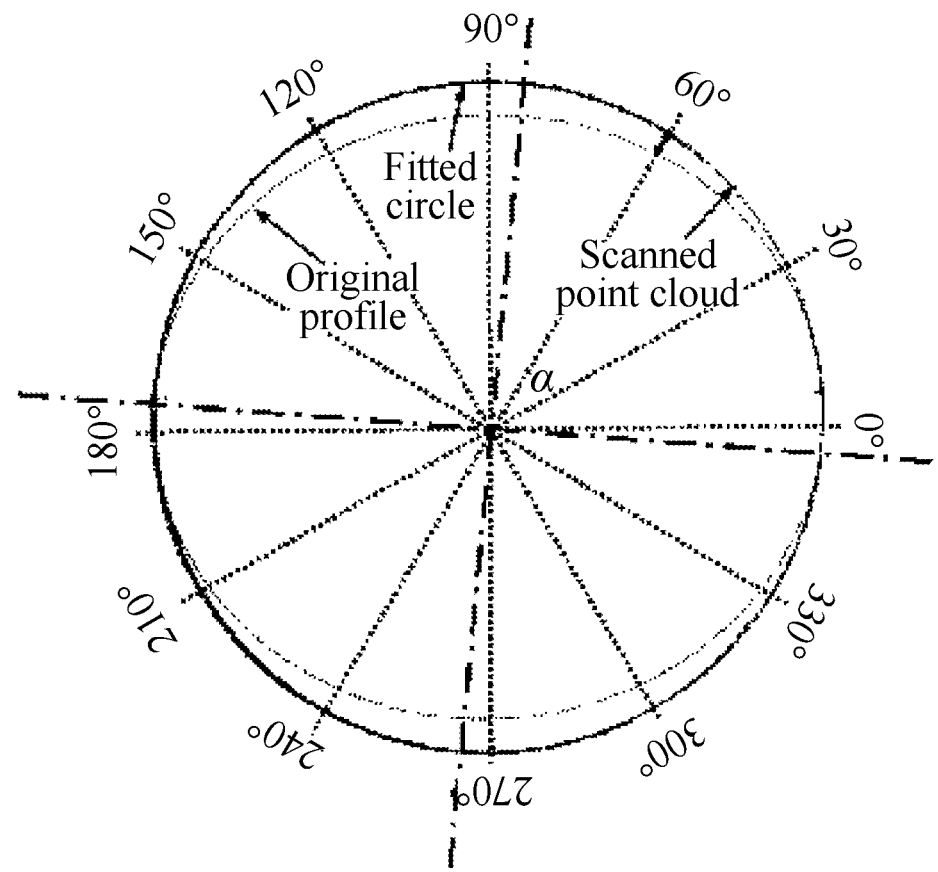
FIG. 4 shows deformation analysis of the cross-section contour of the fuselage component according to an embodiment of this disclosure.

(S502) Different curves are respectively used to represent the original fuselage profile data, the scanned point cloud of the original fuselage and the fitted circle. The overall deformation area of the fuselage and the displacement variation of the fuselage at the angle on are exhibited on the figure. By drawing the variation of each cross-section along each direction, the deformation trend of the fuselage is intuitively analyzed. As shown in FIG. 4, an internal dotted curve represents the original profile of the fuselage, a dotted solid line represents the scanned point cloud of the original fuselage, and a solid curve represents the fitted circle. The part enclosed by the solid curve and the dashed curve is the deformation area of the fuselage. As shown in FIG. 4, at the angle of α, the displacement variation between the fitted circle and original profile of the fuselage is intuitively exhibited. By drawing the displacement variation of each cross-section in all directions, it is more intuitive to analyze the deformation of the fuselage caused by the overload phenomenon resulted from heavy landing during the flight, bad flight maneuvers, and the influence of uneven force due to replacement of large components. With regard to the method provided herein, the original profile of the fuselage is registered with the fitted circle. And the fitting error is calculated by comparing the original profile of the fuselage and the fitted circle, reflecting a gap between the fitting result and the real cross-section data, so as to evaluate the fuselage profile, which has the excellent evaluation accuracy.

Described above are merely preferred embodiments of this disclosure, which are not intended to limit this disclosure. It should be noted that various modifications, changes and improvements made by those skilled in the art without departing from the spirit of this disclosure should still fall within the scope of this disclosure defined by the appended claims.

What is claimed is:

1. A method for analyzing fuselage profile based on measurement data of an aircraft, comprising:
(S1) acquiring point-cloud data of the aircraft via a laser scanner, selecting point-cloud data of a fuselage component from the point-cloud data of the aircraft, and setting a bounding box of the point-cloud data of the fuselage component;
(S2) based on a weighted locally optimal projection (WLOP) operator, extracting a medial axis of the fuselage component from the point-cloud data of the fuselage component according to $L_1$ median curve-skeleton concept of point cloud;
(S3) uniformly sampling the medial axis of the fuselage component into a plurality of skeleton points, and extracting a discrete point set of a cross-section of the fuselage component;
(S4) performing circle fitting on the discrete point set of the cross-section of the fuselage component to obtain a fitted circle of each cross-section slice of the fuselage component and parameters of the fitted circle; and
(S5) calculating a deformation displacement measurement indicator μ of the cross-section of the fuselage component to evaluate a profile of the cross-section of the fuselage component;
wherein the step (S2) comprises:
subjecting the point-cloud data of the fuselage component to smoothing and resampling based on the WLOP operator; and extracting $L_l$ median skeletons varying in size from the point-cloud data of the fuselage component by using a $L_1$ median target energy function with a regular term based on the $L_1$ median curve-skeleton concept to obtain the medial axis of the fuselage component; and the step (S4) comprises:
(S401) regarding any cross-section slice $S_v$, initializing parameters of random sample and consensus (RANSAC) algorithm, setting the maximum number of iterations W, and assuming a score $S(c_0)$ and a threshold of an initial candidate circle $c_0$;
(S402) calculating a sampling probability of each point inside the cross-section slice based on sampling point density of the cross-section slice; wherein the sampling probability of each point inside the cross-section slice is expressed as follows:

$$p_{vk} = \frac{D_{vk} - D_{min}}{D_{max} - D_{min}}, D_{vk} = \frac{|l|}{\pi r^2};$$

wherein $P_{vk}$ indicates a sampling probability of a k-th point inside the cross-section slice; $D_{vk}$ indicates a sampling density of the k-th point inside the cross-section slice; |l| indicates the number of points contained in a local neighborhood l centered around the k-th point; r is a radius of the local neighborhood l; $D_{max}$ indicates a maximum sampling density inside the cross-section slice; and $D_{min}$ indicates a minimum sampling density inside the cross-section slice;
(S403) during one circle fitting, replacing random sampling in the RANSAC algorithm with sampling based on the sampling probability obtained in (S402), and calculating parameters ($a_d$, $b_d$, $r_d$) of a candidate circle Ca corresponding to the sampling probability, wherein as indicates a first point on the candidate circle $C_d$; $b_d$ indicates a second point on the candidate circle $C_d$, and $r_d$ indicates a radius of the candidate circle $C_d$;
(S404) counting a sampling density of each inlier in an inlier set within a threshold of the candidate circle $C_d$, and taking the sampling density as a score $S(C_d) = \Sigma_{e=1}^{m} D_{te}$ of the candidate circle $C_d$, wherein m represents the number of inliers; e is an index of the inliers; and $D_{te}$ is a sampling density of an e-th inlier in the inlier set;
(S405) if $S(C_d) > S(C_0)$, assigning $S(C_d)$ to $S(c_0)$, and deriving the parameters ($a_d$, $b_d$, $r_d$) of the candidate circle $C_d$; and
(S406) if the number of fittings N<W, repeating steps (S403)-(S405), and if N≥W, obtaining fitted circles of all cross-section slices and parameters thereof.

2. The method of claim 1, wherein the $L_l$ median target energy function is expressed as follows:

$$L = \operatorname*{argmin}_{x} \sum_{i \in I} \sum_{j \in J} \|x_i - q_j\| \theta(\|x_i - q_j\|) + \left(\sum_{i \in I} \gamma_i\right) \sum_{i' \in I \setminus \{i\}} \frac{\|x_i - x_{i'}\|}{x_i - x_{i'}};$$

wherein J is the point-cloud data of the fuselage component; j represents an index of a point in the point-cloud data of the fuselage component; $q_j$ represents a j-th point in the point-cloud data of the fuselage component; I represents a set of points on each of the $L_l$ median skeletons; i represents an index of points on the $L_l$ median skeleton; $x_i$ is an i-th point on the $L_l$ median skeleton; $\gamma_i$ is an equilibrium parameter; $\theta(\ )$ indicates a distance weight function; and $x_i'$ indicates a point except for $x_i$ on the $L_l$ median skeleton.

3. The method of claim 1, wherein step (S3) comprises:
(S301) uniformly sampling the medial axis of the fuselage component into the plurality of skeleton points at an interval of 2% of a length of a long diagonal of the bounding box;
(S302) with regard to a skeleton point from the plurality of skeleton points, selecting a point on a front side of the skeleton point and a point on a rear side of the skeleton point, and respectively forming a cross-section slice at the skeleton point, the point on a front side of the skeleton point and the point on a rear side the skeleton point, wherein three cross-section slices are perpendicular to a plane where the medial axis of the fuselage component is located; and
(S303) constructing three local polar coordinate systems centered around the skeleton point, the point on a front side of the skeleton point and the point on a rear side of the skeleton point, respectively, and performing point cloud searching at equal angle by using the three local polar coordinate systems to extract the discrete point set of the cross-section of the fuselage component.

4. The method of claim 3, wherein during the point cloud searching, if the point-cloud data of the fuselage component is not found along a direction, a local curve fitting is performed on the point-cloud data of the fuselage component in a neighborhood of the direction, and point coordinates of a corresponding cross-section along the direction are interpolated.

5. The method of claim 1, wherein the maximum number of iterations W is expressed as follows:

$$W = \frac{\log(1-p)}{\log(1-q^n)}, q = \frac{S(C_0)}{|S_v|};$$

wherein n is the number of points sampled each time; p is a confidence level of the RANSAC algorithm, and p=0.9; q is a ratio of a sampling density of a current candidate circle to the cross-section slice.

6. The method of claim 1, wherein the deformation displacement measurement indicator µ is expressed as follows:

$$\mu = \frac{p_a - O}{\|p_a - O\|} \cdot (p'_a - p_a);$$

wherein $p_a$ indicates a point on a projection plane where an angle between a fitted circle and an origin of a polar coordinate system is a; O is a center point of the polar coordinate system after the cross-section slice is aligned with the projection plane; and $p'_a$ is a point whose cross-section curve after deformation has an angle of a.

7. The method of claim 6, wherein the cross-section curve after deformation represents a deformation curve between the fitted circle and original fuselage profile data.

* * * * *